United States Patent [19]

Zappala

[11] 4,169,989
[45] Oct. 2, 1979

[54] CIRCUIT ARRANGEMENTS FOR PROVIDING SAW-TOOTH CURRENTS IN COILS

[75] Inventor: Giuseppe Zappala, Turin, Italy

[73] Assignee: Indesit Industria Elettrodomestitici Italiana S.p.A., Turin, Italy

[21] Appl. No.: 891,520

[22] Filed: Mar. 30, 1978

[30] Foreign Application Priority Data

Apr. 6, 1977 [IT] Italy ............................. 67758 A/77

[51] Int. Cl.² .......................................... H01J 29/70
[52] U.S. Cl. ................................................... 315/408
[58] Field of Search ........................................ 315/408

[56] References Cited

U.S. PATENT DOCUMENTS

| 3,767,960 | 10/1973 | Ahrens | 315/408 |
| 3,912,972 | 10/1975 | Otten et al. | 315/408 X |
| 3,950,674 | 4/1976 | Joosten et al. | 315/408 X |

FOREIGN PATENT DOCUMENTS

| 2426661 | 12/1974 | Fed. Rep. of Germany | 315/408 |
| 2433296 | 3/1975 | Fed. Rep. of Germany | 315/408 |

*Primary Examiner*—Malcolm F. Hubler
*Attorney, Agent, or Firm*—Lerner, David, Littenberg & Samuel

[57] ABSTRACT

A circuit arrangement for providing a saw-tooth current, with trace and retrace (flyback) intervals, in a deflection coil, in which the amplitude of said current is affected by modulation signal, the arrangement comprising in addition to the said deflection coil, a first retrace capacitor and a first trace capacitor which, together with the deflection coil, form a first oscillating circuit during the retrace interval, a second inductance coil, a second retrace capacitor and a second trace capacitor which form a second oscillating circuit during the retrace interval, a controllable switch connected to a power supply source through a third inductance coil and having a control electrode, connected to a periodic signal source for making the controllable switch conductive during a second part of the trace interval, and a first diode and a second diode, connected in parallel with the first and second retrace capacitors, respectively, the polarity of the diodes being such that they are made conductive by current flowing in the deflection coil and in the second inductance coil, respectively, during the first part of the trace interval, the first retrace capacitor being connected to the controllable switch through a third diode and the second retrace capacitor being connected to the controllable switch through a fourth diode, the third diode being connected with polarity such that it is made conductive by the current flowing in the deflection coil during the second part of the trace interval and the fourth diode being connected with polarity such that it is made conductive by the current flowing in the second inductance coil during the second part of the trace interval.

6 Claims, 4 Drawing Figures

CIRCUIT ARRANGEMENTS FOR PROVIDING SAW-TOOTH CURRENTS IN COILS

BACKGROUND OF THE INVENTION

The present invention relates to a circuit arrangement for providing a saw-tooth current waveform, with trace and retrace (flyback) interval, in a deflection coil, in which the amplitude of the said current is affected by a modulation signal. Such a circuit arrangement may be used in a colour-television kinescope horizontal deflection coil circuit and may comprise, in addition to the said deflection coil, a first retrace capacitor and a first trace capacitor which, together with the deflection coil, form a first oscillating circuit during the retrace interval, a second inductance coil, a second retrace capacitor and a second trace capacitor which form a second oscillating circuit during the retrace interval, a controllable switch connected to a power supply source through a third inductance coil and having a control electrode connected to a periodic signal source for making the controllable switch conductive during a second part of the trace interval, and a first diode and a second diode, connected in parallel with the first and second retrace capacitors, respectively, the polarity of the diodes being such that they are made conductive by current flowing in the deflection coil and in the second inductance coil, respectively, during the first part of the trace interval.

A circuit of this type is described in Italian Pat. application No. 69821-A/76, filed by the present applicant, and is designed, in particular, for providing a line deflection and a modulation circuit (or cushion distortion correction circuit, as it is also called) in the E-W direction on a colour television, in particular, on a set with a 3-in-line-gun mask-type kinescope (cathode ray tube).

The circuit described in the above patent application does not include devices for stabilizing horizontal deflection amplitude.

BRIEF DESCRIPTION OF THE INVENTION

According to the invention there is provided a circuit arrangement for providing a saw-tooth current, with trace and retrace (flyback) intervals, in a deflection coil, in which the amplitude of the said current is affected by a modulation signal, the arrangement comprising, in addition to the said deflection coil, a first retrace capacitor and a first trace capacitor which, together with the deflection coil, form a first oscillating circuit during the retrace interval, a second inductance coil, a second retrace capacitor and a second trace capacitor which form a second oscillating circuit during the retrace interval, a controllable switch connected to a power supply source through a third inductance coil and having a control electrode, connected to a periodic signal source for making the controllable switch conductive during a second part of the trace interval, and a first diode and a second diode, connected in parallel with the first and second retrace capacitors, respectively, the polarity of the diodes being such that they are made conductive by current flowing in the deflection coil and in the second inductance coil, respectively, during the first part of the trace interval, the first retrace capacitor being connected to the controllable switch through a third diode and the second retrace capacitor being connected to the controllable switch through a fourth diode, the third diode being connected with polarity such that it is made conductive by the current flowing in the deflection coil during the second part of the trace interval and the fourth diode being connected with polarity such that it is made conductive by the current flowing in the second inductance coil during the second part of the trace interval.

A preferred circuit arrangement provides for a simple, reliable stabilizing system, and can provide high modulation performance.

BRIEF DESCRIPTION OF THE FIGURES

The invention will be further described, by way of example, with reference to the accompanying drawings, in which.

DETAILED DESCRIPTION OF THE INVENTION

Figure 1:
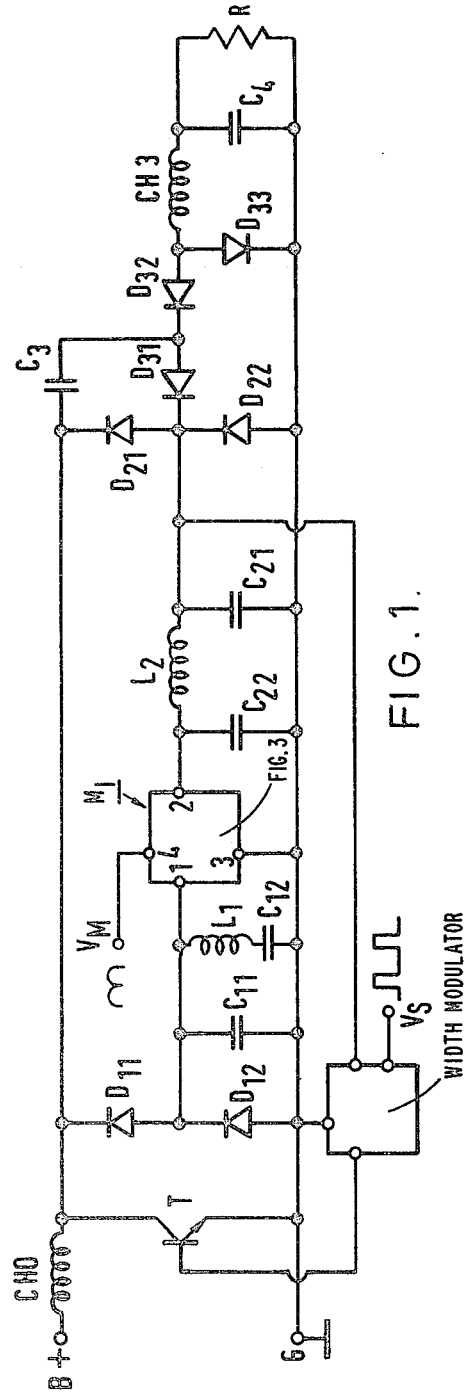
FIG. 1 is a circuit diagram, partially in blocks, of a preferred circuit arrangement for providing horizontal deflection and E-W modulation on a colour television set.

L1 in FIG. 1 indicates a horizontal deflection coil of a television set. In practice, this can be in the form of two windings connected in parallel with one another. For the sake of simplicity, only one winding is shown in the diagram.

A capacitor C12, connected in series with the coil L1, is the so-called trace capacitor which, as is already known, has the dual function of preventing d.c. current from flowing in the deflection coil and correcting the shape of the deflection current by distorting it into an "S" to take into account the fact that the kinescope screen is essentially flat.

The time constant L1-C12 is usually of the order of 0.5 nsec. A capacitor C11, connected in parallel with the series connected capacitor $C_{12}$ and the coil L1, is the so-called tuning or retrace (flyback) capacitor. The time constant L1-C11, which is usually in the order of 15 $\mu$sec., determines the length of the horizontal deflection retrace (flyback) interval.

For the time being, block M1 and the circuit formed by components L2-C21-C22 will be ignored and these parts will be assumed to have been removed, together with diodes D21 and D22, so that the cathode of diode D31 is assumed to be connected to the common junction of D11-D12-C11-L1. This leaves a known type of horizontal deflection circuit, such as the one described in A. Farina's and G. Zappala's article "Self-stabilized Horizontal Deflection Circuit" published in the "Electronics and Telecommunications" magazine, issue No. 6, year 1976, pages 237–241. The circuit shown in FIG. 1 of the accompanying drawings, when simplified as described above, is practically the same as the one shown in FIG. 3 on page 238 of the above magazine.

Figure 4:
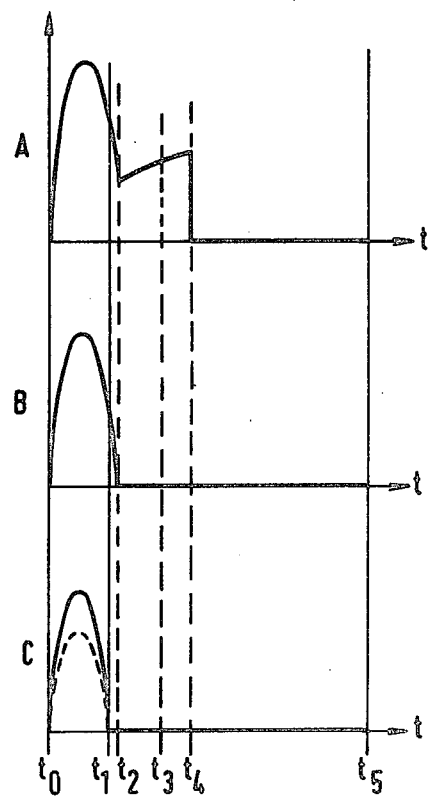
FIG. 4 shows typical voltage curves at certain points in the circuit of FIG. 1.

A short summary of the operating principle of this known circuit will now be given with reference to FIG. 4. Part A in FIG. 4 shows the voltage curve at the terminals of transistor T in FIG. 1, part B shows the voltage curve at the terminals of diode D22 in FIG. 1, and part C shows the voltage curve at the terminals of diode D12 in FIG. 1. Six successive instants $t_0 \ldots t_5$ of the saw-tooth cycle (interval $t_0 - t_5 = 64$ $\mu$sec.) are marked along the X axis. When simplified as described previously, the voltage at the terminals of the diode D12 becomes the voltage shown in part B of FIG. 4.

As can be seen, during the interval $t_0-t_2$ (retrace or flyback interval), the oscillating voltage of the circuit L1-C11-C12 develops freely at the terminals of D12 in that neither diodes D12 and D11 nor transistor T are conductive. The result is the half sinusoid shown in FIG. 4B during the said interval.

During the first part of the trace interval ($t_2-t_4$), the transistor T and the diode D11 remain non-conductive while the diode D12 is conductive. At $t_4$, a control signal on the base makes the transistor T conductive up to the end of the cycle (interval $t_4-t_5$). The voltage across the terminals of the capacitor C11 is therefore practically zero during the interval $t_2-t_5$ which gives rise, in the known way, to a saw-tooth current in the coil L1. The circuit formed by components C3, D31, D32, D33, CH3, C4 and R has the dual function of supplying the deflection circuit (L1-C11-C12) with the energy dissipated in heat and supplying the effective load R.

During the interval $t_2-t_5$ in which the transistor T is conductive, a supply inductor CHO stores up energy which is supplied to the capacitors C3 and C11 during the interval $t_0-t_4$ (in fact, at $t_4$, the capacitor C3 is charged as shown in FIG. 4A: the voltage at the terminals of the transistor T at $t_4$ is substantially the same as that at the terminals of the capacitor $C_3$ as a result of the diode D31 being made conductive by the charging current of the capacitor C3). The energy stored in the capacitor C3 then goes to supply load R. In fact, when the transistor T becomes conductive, the capacitor C3 discharges rapidly into C4-CH3-D32-T after which the energy thus stored in a choke CH3 is supplied to the capacitor C4 through the diode D33.

Variations made to the conduction time of the transistor T result in a variation of the energy stored in the supply inductor CHO and, consequently, in the energy supplied to the circuit. The loop closed by means of circuit M4 between the cathode of the diode D31 and the base of the transistor T serves to regulate the conduction time of the transistor T automatically so as to maintain the peak voltage at the cathode of the diode D31 constant. That is, the circuit M4 supplies the base of the transistor T with a line-frequency pulse, synchronized by sync pulses Vs, the length of which depends on the voltage picked up from the cathode of the diode D31.

This is how the known circuit works. Now consider the complete circuit of FIG. 1. A second tuned circuit (L2-C21-C22) is supplied by the diode D31 and switched by the diodes D21 and D22 in exactly the same way as the first tuned circuit (L1-C11-C12), that is, the deflection circuit. The first tuned circuit, in turn, receives energy from the second circuit by means of a modulation circuit represented by block M1. This second circuit must be tuned so that the time constant L2-C21 of the retrace (flyback) oscillation is slightly greater than that of L1-C11 of the deflection circuit. The result, as shown in FIG. 4, is that the deflection circuit has a retrace (flyback) interval $t_0-t_1$ (FIG. 4C) slightly shorter than the retrace interval $t_0-t_2$ of the second circuit (FIG. 4B). Furthermore, the amplitude of the voltage at the terminals of the diode D12 remains permanently lower than that at the terminals of the diode D22 and can be adjusted within a wide range by means of the modulator M1, with no appreciable effect on retrace (flyback) times or the amplitude of the voltage at the terminals of the diode D22 which is kept constant by the circuit M4. In FIG. 1, terminal 4 of the modulator M1 is shown as being supplied with a parabolic, frame-frequency, control signal $V_M$ for E-W modulation.

Figure 3:
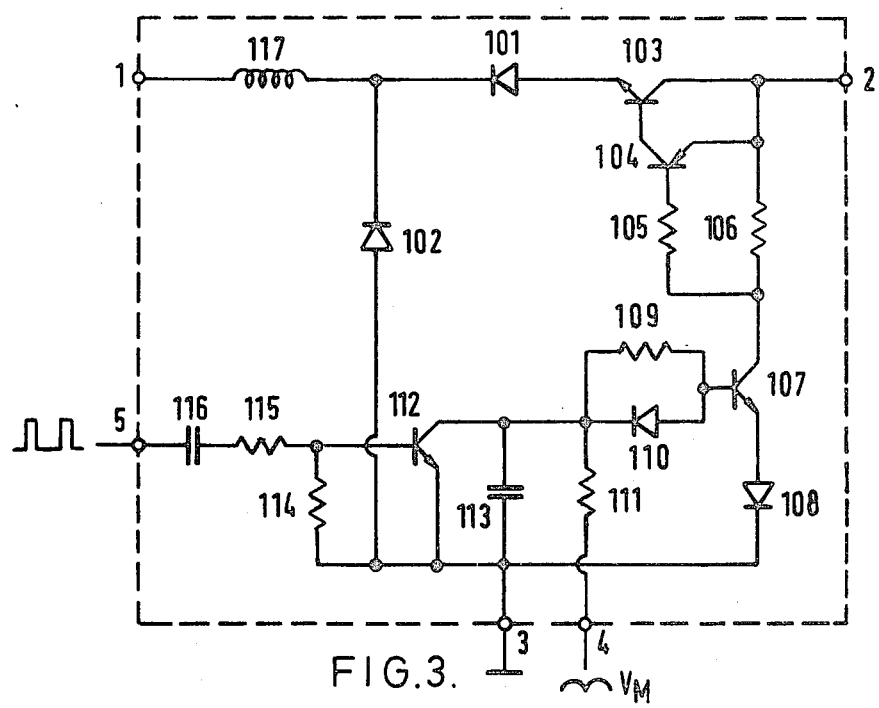
FIG. 3 is a detailed circuit diagram of one of the blocks of FIG. 1.

In its simplest form, the circuit M1 can be an absorption modulator or variable load. In another variation, which offers higher efficiency, it can be a switch modulator, an example of which is shown in FIG. 3.

The circuit of FIG. 3 operates as follows: terminal 5 is supplied with a signal consisting of a sequence of line-frequency pulses. This can be the same signal Vs already discussed in connection with the circuit M4 or else a signal picked up, for example, from the cathode of the diode D22. In the presence of these pulses, a transistor 112 becomes saturated and is disabled between the pulses. A saw-tooth voltage is formed across the terminals of a capacitor 113. A transistor 107, which is connected in a threshold circuit, is conductive during the second part of the saw-tooth for a time interval which increases with increasing voltage at the terminal 4. The pulses thus obtained control a transistor 103 which enables energy to be sent from terminal 2 to terminal 1 during the interval in which the transistor 107 is conductive. When the transistor 107 (and, consequently, the transistor 103) is disabled, terminal 1 is grounded by a diode 102.

If a parabolic, frame-frequency voltage ($V_M$) is applied to the terminal 4, the conduction interval of the transistor 107 will be longer at the mid-frame point and shorter at the beginning and end. Consequently, the current in the coil L1 will be larger at the mid-frame point and smaller at the beginning and end while the cushion distortion of the yoke-kinescope assembly will be compensated.

In FIG. 4C, the heavy black line is the voltage of a line at the beginning and end of the frame while the dotted line represents a mid-frame line. The conduction time of the transistor T (FIG. 4A) also varies accordingly as a result of the control circuit M4.

The coil L2 can be formed by the primary winding of a transformer which may be equipped with suitable secondary windings for providing the extra-high-voltage for the kinescope anode as well as other auxiliary voltages. These voltages remain stabilized and are, therefore, unaffected by E-W modulation or other variations (in supply voltage or load currents).

The load R can be formed by other low-voltage circuits in the set, such as the vertical deflection circuits.

Figure 2:
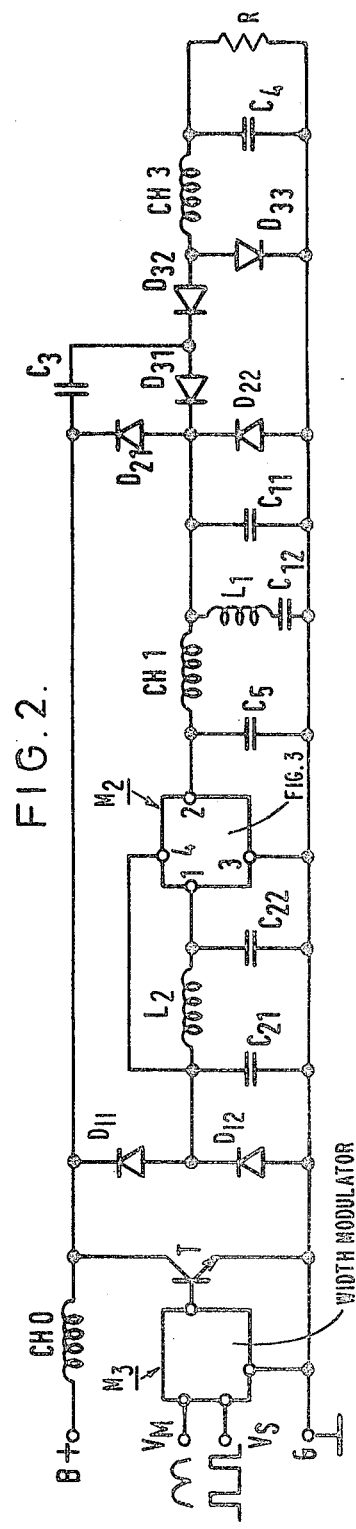
FIG. 2 shows a possible variation of the circuit of FIG. 1.

FIG. 2 shows a variation of the circuit of FIG. 1. In the circuit of FIG. 2, the deflection circuit (L1-C11-C12) is supplied by the cathode of the diode D31. The second tuned circuit (L2-C21-C22) is, in turn, supplied by the deflection circuit through a filter CH1-C5 and a control circuit M2. The circuit M2 samples the voltage at the terminals of the capacitor C21 and regulates the flow of energy from the capacitor C5 to the capacitor C22 so that the voltage across the terminals of the capacitor C21 remains substantially constant. The circuit M2 can be made in the same way as the circuit M1 in FIG. 1 (that is, in the same way as the circuit of FIG. 3). The conduction time of the transistor T is regulated in the circuit of FIG. 2 by a circuit M3, which may be similar to the circuit M4 in FIG. 1, but which is controlled by a parabolic, frame-frequency signal $V_M$.

Like the circuit of FIG. 1, the circuit of FIG. 2 enables the deflection current flowing in the coil L1 to be modulated by keeping the voltage constant at the terminals of a second coil (L2) from which the auxiliary circuits can be supplied. Unlike the circuit of FIG. 1, the retrace (flyback) time of the second circuit (L2-C21-C22) in the circuit of FIG. 2 must be shorter than that of the deflection circuit (L1-C11-C12). The voltage across the terminals of the second circuit must also always be lower than that at the deflection circuit terminals.

The advantages of the preferred circuit arrangements will be clearly seen from the description given. To those skilled in the art, it will be clear that variations can be made to the circuit described without, however, departing from the scope of the present invention. Table of main components of the circuit of FIG. 1:

| CHO | Supply inductor | 6.75 mH |
| --- | --- | --- |
| L1 | Deflection coil inductor | 0.31 mH |
| L2 | Transformer inductor | 2.46 mH |
| C11 | Retrace capacitance | 47 nF |
| C12 | Trace capacitance | 1.8 uF |
| C21 | Retrace capacitance | 6.8 nF |
| C22 | Trace capacitance | 2.2 uF |
| C3 | Coupling capacity | 47 nF |

Table of main components of the circuit of FIG. 3:

| 103 | Transistor | BD 139 |
| --- | --- | --- |
| 104 | Transistor | BD 140 |
| 105 | Resistor | 1 Kohm |
| 106 | Resistor | 100 Ohm |
| 107 | Transistor | BF 458 |
| 109 | Resistor | 10 Kohm |
| 111 | Resistor | 1.2 Kohm |
| 112 | Transistor | BC 171 |
| 113 | Condenser | 22 nF |
| 114 | Resistor | 1.2 Kohm |
| 116 | Condenser | 2.7 nF |

I claim:

1. A circuit arrangement for providing a saw-tooth current in a deflection coil in which the amplitude of the current is affected by a modulation signal, said saw-tooth current having a trace and a retrace interval, said arrangement comprising:

a first retrace capacitor and a first trace capacitor connected to said deflection coil to form a first oscillatory circuit;

a second retrace capacitor, a second trace capacitor and a first inductance coil connected together to form a second oscillatory circuit;

a controllable switch having a control electrode and first and second controlled electrodes; a second inductance coil; a power supply source; a periodic signal source; and first, second, third, and fourth diodes, said trace interval having first and second portions, wherein said first and second control electrodes of said controllable switch connects said second inductance coil to said power supply source when said controllable switch is actuated by said periodic signal source during said second part of said trace interval, said first and second diodes being connected in parallel with said first and second retrace capacitors respectively, with polarity such that said first and second diodes are made conductive by current flowing in said deflection coil and said first inductance coil respectively, during said first part of said trace interval, said first retrace capacitor being connected to said first controlled electrode of said controllable switch through said third diode and said second retrace capacitor being connected to said first controlled electrode of said controllable switch through said fourth diode, said third diode being connected with polarity such that it is made conductive by current flowing in said deflection coil during said second part of said trace interval and said fourth diode being connected with polarity such that it is made conductive by current flowing in said first inductance coil during said second part of said trace interval; and circuit means for controllably transferring energy from one of said first and second oscillatory circuits to the other thereof during said retrace interval.

2. A circuit arrangement as set forth in claim 1, wherein there are provided means for controlling said periodic signal source so as to vary the conduction time of said controllable switch.

3. A circuit arrangement as set forth in claim 2, wherein said circuit means varies said transfer of energy periodically so as to modulate the amplitude of the current in said deflection coil periodically and the current in said second inductance coil is maintained substantially constant by the combination of said periodic signal source and said control means.

4. A circuit arrangement as set forth in claim 2, wherein said periodic signal source is controlled by said modulation signal and said circuit means maintains said current in said second inductance coil substantially constant, the current in said deflection coil varying according to said modulation signal.

5. A circuit arrangement as set forth in claim 1, wherein there are provided coupling means for supplying energy periodically to one of said first and second oscillating circuits during said retrace interval.

6. A circuit arrangement as set forth in claim 5, wherein said coupling means include a capacitor connected between said controllable switch and one of said first and second oscillating circuits during said retrace interval.

* * * * *